United States Patent [19]

Bielinski et al.

[11] Patent Number: 4,642,481

[45] Date of Patent: Feb. 10, 1987

[54] SOLID STATE HYBRID SWITCH

[75] Inventors: Ralph F. Bielinski, South Milwaukee; James R. Jaeschke, Waukesha; Slobodan Krstic, Milwaukee; Earl T. Piber, Oconomowoc; Peter J. Theisen, West Bend, all of Wis.

[73] Assignee: Eaton Corporation, Cleveland, Ohio

[21] Appl. No.: 763,843

[22] Filed: Aug. 8, 1985

[51] Int. Cl.[4] .......... H03K 17/72

[52] U.S. Cl. .......... 307/252 UA; 307/252 M; 307/131; 307/570

[58] Field of Search ....... 307/252 UA, 252 N, 252 M, 307/252 Q, 252 T, 542, 549, 246, 12, 30, 38, 103, 108, 131, 75, 570

[56] References Cited

U.S. PATENT DOCUMENTS

| | | | |
|---|---|---|---|
| 3,330,992 | 7/1967 | Perrins . | |
| 3,335,291 | 8/1967 | Gutzwiller | 307/252 |
| 3,582,684 | 6/1971 | Gregson | 307/252 UA |
| 3,665,212 | 5/1972 | Roberts et al. | 307/252 T |
| 3,708,696 | 1/1973 | Lorenz | 307/252 B |
| 3,902,080 | 8/1975 | St. Clair et al. | 307/252 B |
| 3,956,644 | 5/1976 | Zambre | 307/252 UA |
| 4,158,150 | 6/1979 | Dever | 307/252 B |
| 4,319,318 | 3/1982 | Rippel et al. | 307/252 M |
| 4,413,193 | 11/1983 | Crockett | 307/311 |
| 4,420,784 | 12/1983 | Chen et al. | 361/7 |
| 4,571,499 | 2/1986 | Wein | 307/252 P |

OTHER PUBLICATIONS

Commutation and Erosion in Hybrid Contactor Systems, S. Greitzke and M. Lindmayer, Sep., 1984.

*Primary Examiner*—John Zazworsky

*Attorney, Agent, or Firm*—D. A. Rowe; W. A. Autio

[57] ABSTRACT

A hybrid switch (2) having a solid state circuit (2*a*) including a thyristor (SCR) for closing and reopening a supply circuit (S,4,6) to a load (L) and contacts including an isolating contact (S1) for connecting power to and disconnecting power from the solid state circuit (2*a*), a control contact (S2) for initiating turn-on and turn-off of the thyristor (SCR), and a bypass contact (S3) for shunting the solid state circuit (2*a*) after the load has been energized. A zero voltage crossover circuit (ZVC) allows turn-on of the thyristor (SCR) only when the A.C. supply voltage is below a preset value to avoid arcing at the contacts on closing. The inherent zero current crossing turn-off characteristic of the thyristor (SCR) avoids arcing at the contacts on opening. A pushbutton switch (8,10) provides a mechanically controlled time delay of a minimum of the time of one-half cycle of the power supply voltage between the closing of the control contact (S2) and the closing of the bypass contact (S3) and also between the opening of the control contact (S2) and the opening of the isolation contact (S1) to allow operation of the thyristor (SCR) at zero voltage or zero current thereby to avoid arcing for long contact life and elimination of EMI (electromagnetic interference).

10 Claims, 8 Drawing Figures

Fig. 6
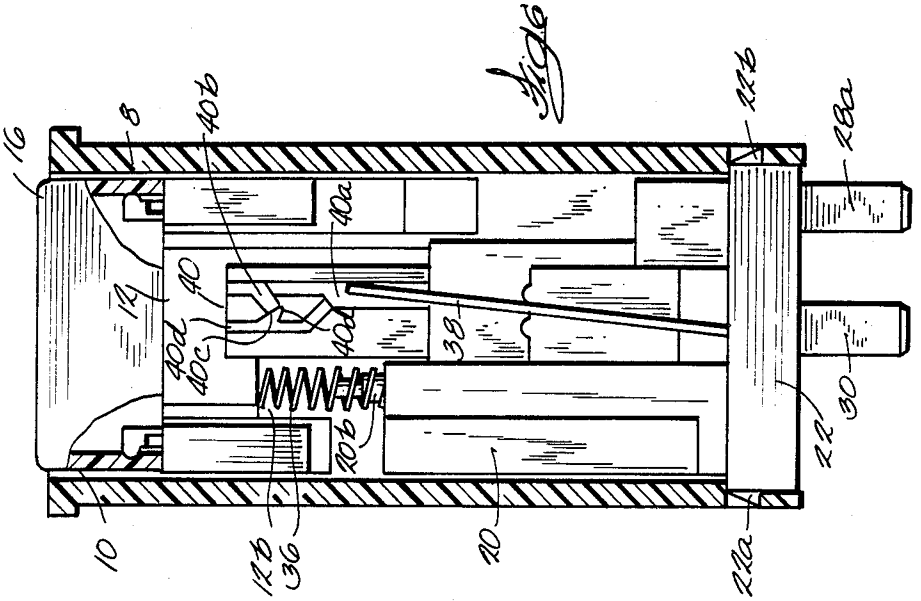
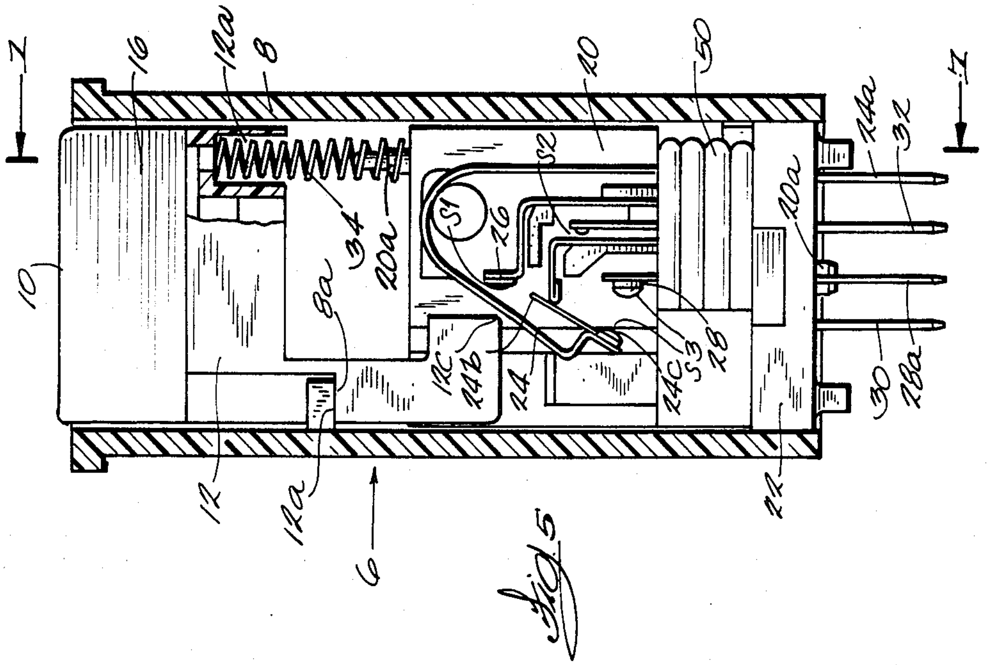
Fig. 5

SOLID STATE HYBRID SWITCH

BACKGROUND OF THE INVENTION

Solid state hybrid switches have been known heretofore. For example, C. G. Chen et al U.S. Pat. No. 4,420,784, dated Dec. 13, 1983, shows one form of hybrid D.C. power controller of the relay/circuit breaker type that uses a hybrid arrangement of hard contacts and power FETs in cooperative functional combination which is especially adapted for switching 270 volt D.C. power systems in the low atmospheric pressure environments. Also, A. R. Perrins U.S. Pat. No. 3,330,992, dated July 11, 1967, shows an A.C. load energizing circuit having a pair of reverse-parallel controlled rectifiers, a first switch for applying anode voltage to these controlled rectifiers, a second switch for gating these rectifiers into conduction to establish the circuit to the load and a third switch for shunting the controlled rectifiers. A variety of zero voltage solid state switching circuits have also been known. However, these prior switching circuits have been handicapped by certain disadvantages such as, for example, being rather complex in structure with large numbers of components, insufficient contact life, current leakage in the off condition or inadequate switching performance. Accordingly, it has been found desirable to provide an improved solid state hybrid switch that overcomes the aforesaid advantages.

SUMMARY OF THE INVENTION

An object of the invention is to provide an improved solid state hybrid switch.

A more specific object of the invention is to provide an improved solid state hybrid switch that extends the contact life and to limit EMI (electromagnetic interference) to a low value to equal the mechanical switch life.

Another specific object of the invention is to provide an improved solid state hybrid switch that prevents any leakage current through the load when in its off condition.

Another specific object of the invention is to provide a switch of the aformentioned type that incorporates increased immunity to false firing due to line transients.

Another specific object of the invention is to provide a switch of the aformentioned type that involves low solid state element power dissipation.

Another specific object of the invention is to provide a solid state hybrid switch that elminates the disadvantages of a completely solid state switch.

Another specific object of the invention is to provide a switch of the aformentioned type that incorporates the combination of features of extended contact life due to arcless zero voltage turn-on and zero current turn-off, no leakage current through the load in the off condition, low on-state voltage drop across the switch element, increased immunity to false firing due to line transients, low solid state element power dissipation and minimum number of components.

Another specific object of the invention is to provide a solid state hybrid switch of the aformentioned type with an adequate time delay between the closing of the control contact which renders the solid state element conducting at the next zero voltage crossing point to extablish the circuit and the subsequent closing of the bypass contact so as to prevent arcing on the latter as well as to provide an adequate time delay between the opening of the control contact which renders the solid state element nonconducting at the next zero current crossing point to interrupt the circuit and the subsequent opening of the isolation contact to prevent arcing at the latter.

Other objects and advantages of the invention will hereinafter appear.

BRIEF DESCRIPTION OF THE DRAWINGS

FIG. 5 is a cross sectional view taken substantially along line 5—5 of FIG. 8 of the solid state hybrid switch showing the contacts also shown in FIG. 1 as well as the pushbutton for actuating the same.

FIG. 5 is a cross sectional view taken substantially along line 6—6 of FIG. 8 of the solid state hybrid switch showing the push-push latching mechanism as well as the pushbutton thereof.

DESCRIPTION OF THE PREFERRED EMBODIMENT

Figure 1:
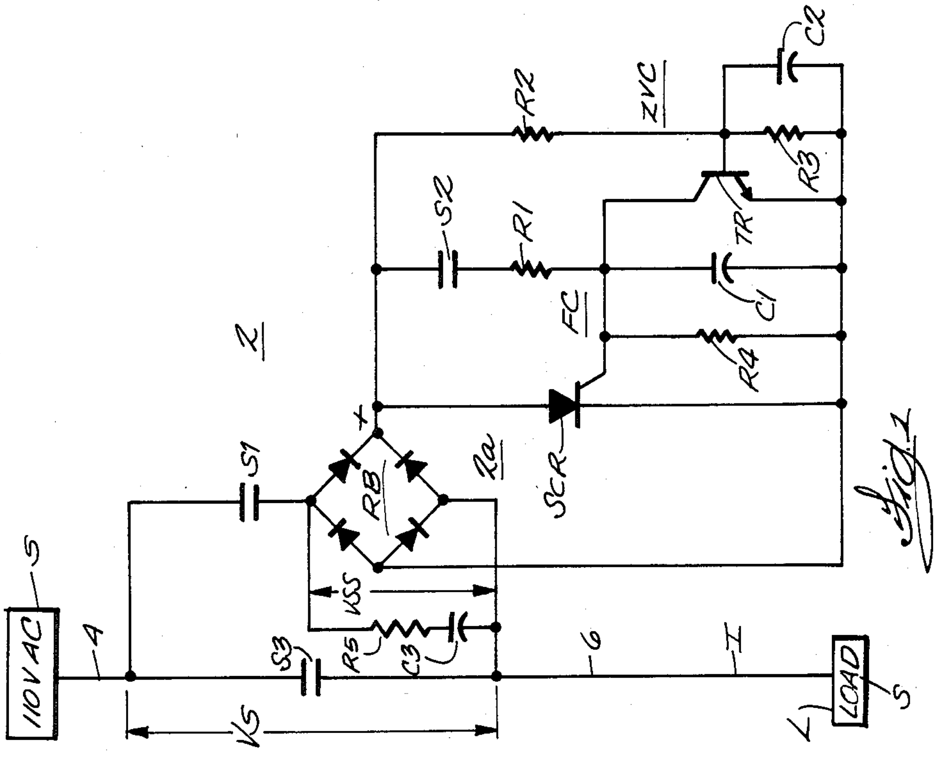
FIG. 1 is a circuit diagram of the solid state hybrid switch showing schematically the components thereof.

Referring to FIG. 1, there is shown a circuit diagram for a solid state hybrid switch 2 constructed in accordance with the invention. As shown therein, this switch 2 is connected by conductors 4 and 6 between a 110 volt A.C. source S and a load L with the other side of the load being connected to the other side of source S. This switch 2 is called a solid state hybrid switch because it includes not only a solid state switching element SCR but also switch contacts S1, S2 and S3. Contacts S1 are called series or isolating contacts because they are connected in series with the input terminals of rectifier bridge RB between source S and load L and when open serve to isolate the electronic circuit *2a* including the SCR from the source to prevent leakage current flowing therethrough to the load. Contacts S2 are called control contacts because they are used to turn the solid state portion of the switch on and off. Contacts S3 are called bypass contacts because they serve to shunt the solid state element or thyristor SCR to conduct the load current after the load has been energized.

As shown in FIG. 1, the anode and cathode of the SCR are connected from the positive output terminal of rectifier bridge RB to the negative output terminal thereof. A firing circuit for the SCR comprises control contacts S2 connected from the positive output terminal of rectifier bridge RB through resistors R1 and R4 to the cathode of the SCR with the junction between resistors R1 and R4 being connected to the gate of the SCR and a capacitor C1 connected across resistor R4. Capacitor C1 serves to suppress transient voltages to prevent inadvertent turn-on of the SCR and thus renders the switch immune to false firing due to line transients. This solid state hybrid switch also comprises a zero voltage crossing circuit which includes a transistor TR of the N-P-N conductivity type having its collector and emitter connected from the gate to the cathode of the SCR and a voltage divider comprising resistors R2 and R3 connected from the positive output terminal of rectifier bridge RB to the negative output terminal thereof with the junction of these two resistors connected to the base of transistor TR and a delay capacitor C2 connected across resistor R3 that prevents unwanted shunting of the SCR gate due to line transients. Bypass contacts S3 are connected across series contacts S1 and rectifier bridge RB. A snubber circuit having resistor R5 and capacitor C3 in series is connected across the input of rectifier bridge RB to suppress voltage peaks.

Figure 2:
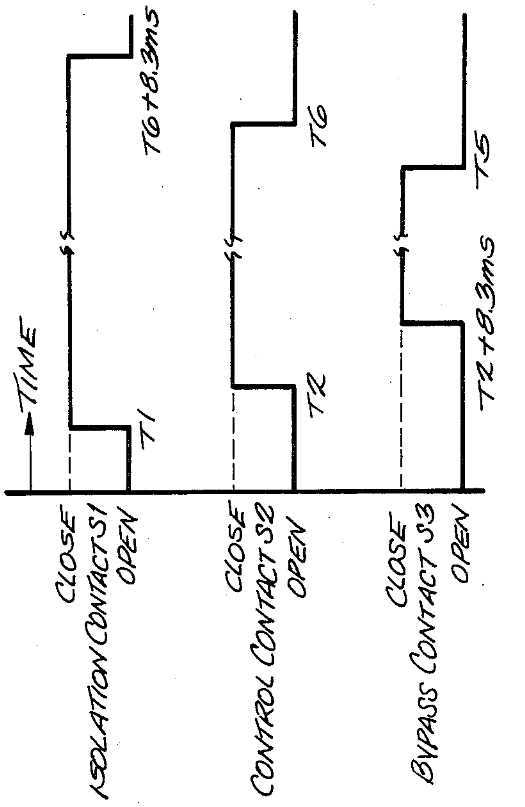
FIG. 2 is a graph showing turn-on and turn-off operating characteristics of the circuit of FIG. 1.

To close the solid state hybrid switch of FIG. 1 (load turn on), contacts S1, S2 and S3 are closed in sequence in that order as shown in FIG. 2 by means hereinafter described in connection with FIGS. 5-8. When contact S1 is closed, power supply S is connected across the input terminals of rectifier bridge RB. As a result, voltage is applied from the positive and negative output terminals of rectifier bridge RB across the anode and cathode of the SCR. Also, a voltage is applied across and current flows from the positive output terminal of rectifier bridge RB through voltage divider resistors R2 and R3 to the negative terminal thereof to apply a proper reduced voltage from the junction thereof to the base of transistor TR. Capacitor C2 provides a short delay in the turn-on of transistor TR to enable turn-on of the SCR at zero current crossings when the solid state hybrid switch 2 is applied to an inductive load. This closure of contact S1 is shown by the curve at the upper portion of FIG. 2 as time T1. This contact S1 closure is also shown as time T1 on the middle curve in the graph of FIG. 3. As shown also by the middle curve in FIG. 3, following closure of contact S1, the voltage VSS across the solid state switch 2*a* thereafter appears across rectifier bridge RB. The D.C. voltage at the output of rectifier bridge RB is applied through voltage divider R2, R3 to the base of transistor TR for purposes hereinafter described. Control contact S2 closes next at time T2 as indicated by the middle curve in FIG. 2. As a result, the voltage at the output of rectifier bridge RB is applied from the junction of voltage divider resistors R1 and R4 in firing circuit FC to the gate of the SCR.

Figure 3:
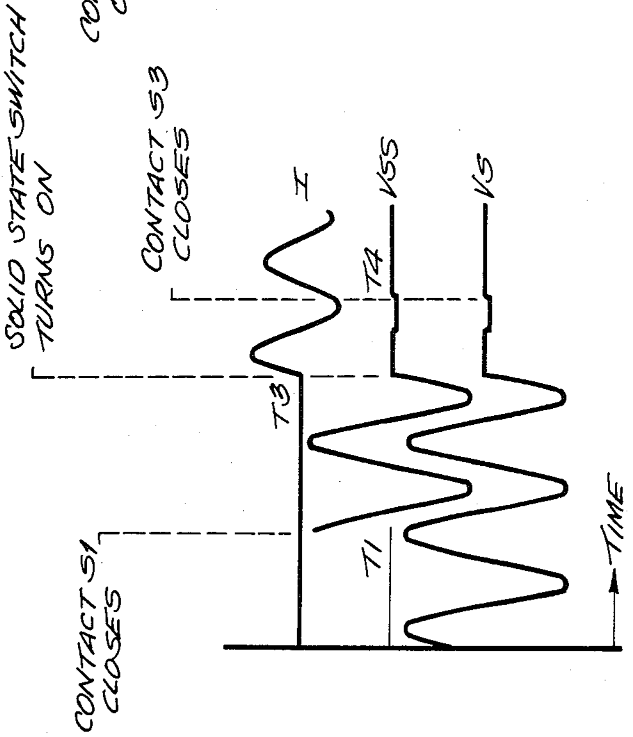
FIG. 3 is a graph of voltage and current waveforms showing the effect thereon of turn-on of the switch.

Zero voltage crossing circuit ZVC operates as follows. Let it be assumed that voltage divider resistors R2 and R3 are given values such that the voltage applied from the junction thereof to the base of transistor TR will turn it on if the supply voltage is 20 volts or above and will not turn it on if the supply voltage is 15 volts or below. These voltages are selected low enough so as to substantially eliminate any electromagnetic inteference (EMI) being generated by this circuit but high enough (at least 15 volts) to insure firing of the SCR after the bypass contact opens and a very short arc (very short time interval arc) appears thereon on closing bounce or opening. The terms "arcless" an "substantially arcless" refer to a condition where a minimum arc is necessary to insure firing of the SCR but such arc is of such short time duration as to cause no significant damage to the contacts. Therefore, transistor TR shunts the gate-cathode circuit of the SCR to prevent firing ciruit FC from rendering the SCR conductive until the supply voltage decreases below 15 volts and approaches zero value. When this happens, transistor TR turns off, allowing firing circuit FC to render the SCR conducting at time T3 in FIG. 3 thereby dropping the voltage across the solid state switch VSS as well as the voltage across the entire switch VS to zero as shown by the middle and lower curves in FIG. 3 and applying current to the load as shown by the upper curve I in FIG. 3. Finally, bypass contact S3 closes with a time delay following the closure of contact S2 as shown in FIG. 2. This time delay is set at a minimum of 8.3 ms which is the time of one-half cycle of the 60 cycle power supply source but it may be longer. This time delay insures that following the closure of contact S2, the supply voltage has had time to reach zero resulting in turn-off of transistor TR and firing of the SCR before the bypass contact closes thereby to prevent any arcing on the bypass contact. This bypass contact closes at time T4 as shown in FIG. 3. As shown by curves VSS and VS in FIG. 3, prior to closure of the bypass contact S3 there was a small voltage drop across rectifier bridge RB and the SCR during the negative half cycle of the supply voltage. However, after closure of contact S3, the solid state switch is shunted thereby. From the foregoing, it will be apparent that closing contacts S1, S2 and S3 in the sequence and with the time delay hereinbefore described, the switch can be turned on in an substantially arcless manner thereby to extend contact life and improve switching performance in that EMI will not be generated.

Figure 4:
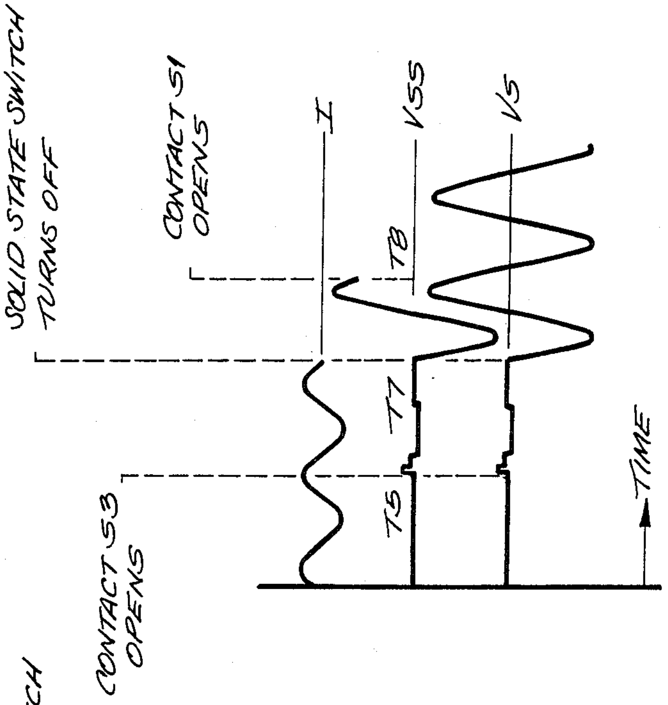
FIG. 4 is a graph of voltage and current waveforms showing the effect thereon of turn-off of the switch.

The right-hand portion of FIG. 2 and FIG. 4 show the function of the solid state hybrid switch when it is opened (load turn-off). For this purpose, contact S3 is opened at time T5 as shown in FIG. 2, contact S2 is opened at time T6 and contact S1 is opened with a time delay of a minimum of 8.3 ms following time T6, that is, the opening of contact S2. As shown in FIG. 4, contact S3 opens at time T5 following which a small arc voltage fires the SCR and then a smaller voltage drop appears in voltage VSS and also in voltage VS since the current is immediately shunted through rectifier bridge RB and the SCR, the SCR being refired at the beginning of each voltage half cycle. Contact S2 opens next but the SCR remains turned on allowing current to flow to the load until such time as the current decreases to zero value as shown by the upper curve I in FIG. 4. Thus, the SCR turns off at time T7 causing voltage VSS to appear across the solid state switch 2*a* and also causing voltage VS to appear across the entire switch 2. After the time delay hereinbefore mentioned, contact S1 opens as shown by the upper curve in FIG. 2. The opening of contact S1 is also delayed a minimum of 8.3 ms which is the time of a half cycle of the current wave of the power supply source to insure that the SCR has had time to turn off and interrupt the circuit before contact S1 opens. In this way, arcing at contact S1 is prevented. Contact S1 opens at time T8 as shown in FIG. 4 to isolate the SCR from the power supply and thereby prevent any leakage current therethrough to the load.

Figure 8:
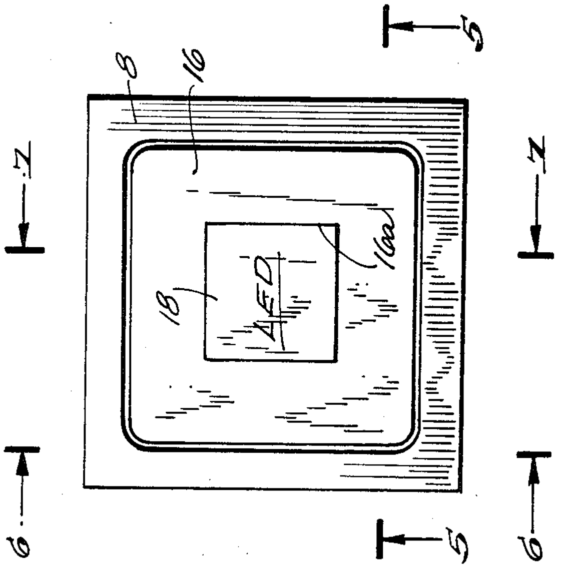
FIG. 8 is a top view of the switch of FIGS. 5–7.
Figure 7:
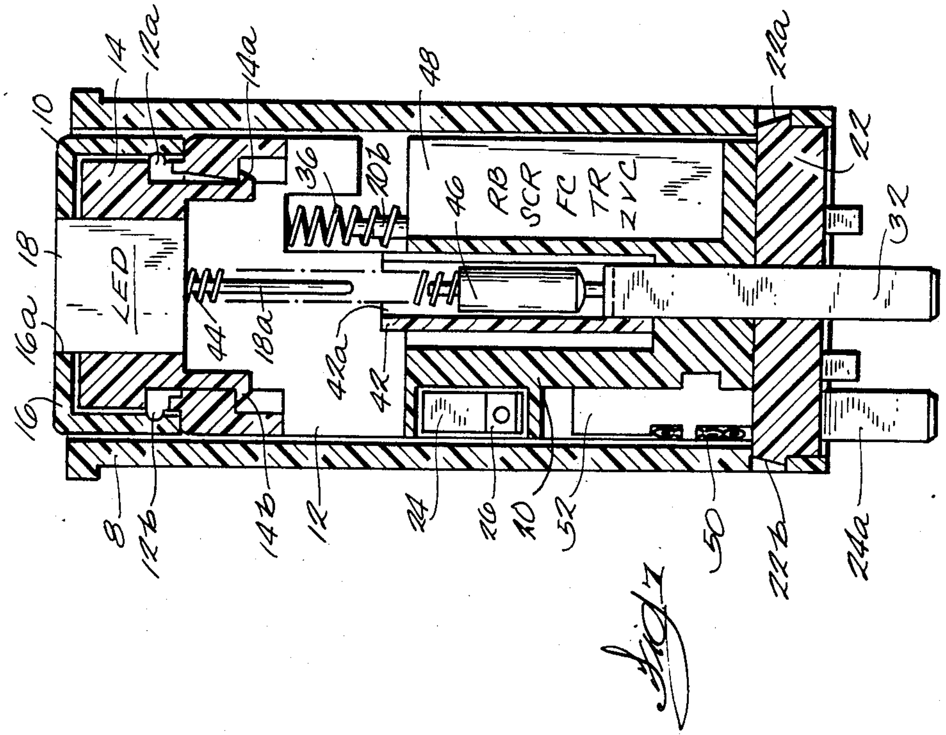
FIG. 7 is a cross sectional view taken substantially along line 7—7 of FIG. 8 of the solid state hybrid switch showing the pushbutton as well as the space for mounting the electronic components of FIG. 1 therein.

A pushbutton switch for enclosing the contacts and electronic circuit of FIG. 1 is shown in FIGS. 5-8. As shown therein, the switch is provided with an insulating body or housing 8 made of plastic molding material or the like which is vertically elongated and has a generally square configuration in top view as shown in FIG. 8. At the upper portion of this housing there is provided a vertically slidable pushbutton actuator 10 the upper surface of which is substantially flush with the upper surface of the housing to require deliberate depression thereof for actution of the switch and which prevents bumping thereof and consequent accidential operation of the switch. This pushbutton actuator is made up of a number of parts shown more clearly in FIGS. 6 and 7. These parts include an actuator or cam block member 12 which is arranged for limited vertical sliding movement in the housing by means of a shoulder 12*a* thereon and an abutment 8*a* molded integrally in the inner wall of the housing as shown in FIG. 5. Preferably another similar shoulder and abutment is provided in another corner of the switch for smoothness of operation. As shown in FIG. 7, a plastic LED retainer or recepticle 14 is snap-in mounted by a pair of hooks 14*a* and 14*b* on top of actuator 12. This recepticle 14 has mounted at the upper central portion thereof a visual indicator in the form of a light emitting diode LED as shown in FIG. 7 with the upper portion of the LED extending slightly above the upper surface of retainer 14. A plastic lens or cover 16 is snap-in mounted onto a pair of snap-in elements 12*a* and 12*b* at the upper portion of actuator 12 and this cover 16 is provided with a hole 16*a* at its upper surface through which the LED extends substantially flush therewith and is exposed to provide a light indicator. LED 18 has a pair of terminals 18*a* extending downwardly therefrom one of which is shown in FIG. 7. A terminal block 20 is mounted in the lower portion of the housing and is connected to a cover or base 2 which closes the lower end of the housing. For this purpose, an integrally molded pin 20*a* at the lower end of the terminal block extends through a hole in base 22 as shown in FIG. 5 and is heat welded therebelow to secure the parts together. This subassembly or terminal block and base is mounted in the housing by a pair of snap-in saw-tooth shaped projections 22*a* and 22*b* on opposite sides of base 22 shown in FIGS. 6 and 7 which engage slots in opposite walls of the housing. Contacts S1, S2 and S3 are constructed and mounted in terminal block 20 as shown in FIG. 5 so as to be closed by atuator 12 in a given timed order and opened in the reverse order. The movable portion 24 of contact S1 is connected to a terminal 24*a* which extends down through base 22 for connection to the power supply source S whereas stationary portion 26 of contact S1 is connected to the electronic circuit mounted within the housing as hereinafter described. Movable portion 24 of contact S1 also has an insulating strip 24*b* secured thereto for engaging and operating contact S2. Both the movable and stationary portions of contact S2 are connected to the electronic circuit. The movable portion 24*c* of contact S3 is also mounted on the common movable portion 24 of contact S1 as shown in FIG. 5. The stationary portion 28 of contact S3 is connected to a terminal 28*a* which extends down through base 22 for connection to the load L. Terminals 30 and 32 are connected to the LED as hereinafter described.

A pair of helical return springs 34 and 36 for the pushbutton actuator are mounted in spaced apart relation between terminal block 20 and actuator 12 as shown in FIGS. 5 and 6. To retain these return springs in place, terminal block 20 is provided with a pair of projections 20*a* and 20*b* which extend up into the lower ends of these helical compression springs 34 and 36 and the upper ends of the springs extend into blind holes 12*a* and 12*b* in actuator 12. These springs 34 and 36 normally bias the pushbutton actuator upwardly so that shoulders 8*a* abut stops 12*a* as shown in FIG. 5. When the pushbutton is depressed against the forces of these springs 34 and 36, tip 12*c* of the actuator engages and slides down along movable portion 24 of contact S1 to close this contact first. As this actuator travels downwardly, insulating strip 24*b* next closes contact S2. Further and longer movement of the actuator downwardly causes movable portion 24*c* of contact S3 to engage stationary portion 28 thereof to close contact S3.

The construction and arrangement of the switch parts provides the aforementioned time delay between closure of contacts S2 and S3. This time delay is assured by the switch construction whereby the pushbutton must be depressed into the housing by the finger of the user assuring a limited speed of finger motion, the actuator is arranged to slide on movable portion 24 of contact S1 a predetermined distance between the closure of contacts S2 and S3, and the normal speed of finger motion is three to five inches per second. The pushbutton cannot be snapped.

FIG. 6 shows a maintaining means for the switch. This maintaining means comprises a latch wire hook 38 that is retained in the terminal block by a right angle bend at its lower portion and has a right angle bend at its upper portion the tip of which is biased against an M-cam 40 integrally molded on actuator 12. This M-cam has grooves of four different depths as follows. When the pushbutton is depressed, the tip of latch wire hook 38 moved up along groove 40*a* until, due to its inward bias, it drops into groove 40*b* at the end of the pushbutton stroke where all three contacts S1, S2 and S3 are closed. Release of the pushbutton at this point causes it to be raised slightly by return springs 34 and 36 whereby the tip of hook 38 moves downwardly and toward the left along groove 40*b* until it drops inwardly into groove 40*c* and stops in the V-shaped notch 40*d* to retain the pushbutton in its depressed position with the contacts closed.

To reopen the contacts, a second short push down on the pushbutton causes the tip of latch hook 38 to move upwardly along groove 40*c* until it drops inwardly into groove 40*d* whereupon release of the pushbutton causes the tip of hook 38 to move down along groove 40*c* and, due to its rightwardly direction bias, to return to the position shown in FIG. 6 as the return springs 34 and 36 restore the pushbutton to its uppermost position.

The construction and arrangement of the switch parts provides the aforementioned time delay between opening of contacts S2 and S1. This time delay is assured by the switch construction whereby the pushbutton must return from within the housing with the controlled speed provided by the spring force and the attendant friction, the actuator is arranged to slide on movable portion 24 of contact S1 a predetermined distance between the opening of contacts S2 and S1, and if the switch is the maintained type as illustrated and described, the normal speed of finger motion of three to five inches per second following the short depression of the pushbutton to release the latch limits the pushbutton return speed, and the pushbutton operating entirely within the housing cannot be snapped. In addition, insulator strip 24*b* being resilient allows opening of contact S2 substantially in advance of opening of contact S1.

As shown in FIG. 7, an insulating plastic spring housing 42 is mounted in a slot in terminal block 20. This spring housing 42 is generally H-shaped in horizontal cross section so that it has a pair of U-shaped vertical channels 42*a*, one on each side thereof for the two connector springs of the LED, one of such springs 44 being shown in FIG. 7. As shown therein, terminal 18*a* extends down into the upper end of connector spring 44 and a terminal of a resistor 46 or the like extends up into the lower end of spring 44 to electrically connect the two together while allowing limited vertical movement of the pushbutton. The lower terminal of resistor 46 is connected to a terminal 42 that extends down through a slot in base 22 for connection to an external circuit. The other terminal of the LED is similarly connected through a helical connector spring to LED terminal 30 whereby the LED may be energized by an external electrical circuit. As shown in FIG. 7, terminal block 20 has a portion 48 into which is mounted the electronic circuit shown in FIG. 1. As indicated thereat, rectifier bridge RB, the SCR, firing circuit FC, transistor TR and zero voltage circuit ZVC are all mounted in this area 48 of the terminal block and are connected to the contacts and load terminal 28*a* by a multiple wire cable 50 shown in FIGS. 5 and 7.

While the apparatus hereinbefore described is effectively adapted to fulfill the objects stated, it is to be understood that the invention is not intended to be confined to the particular solid state hybrid switch disclosed, inasmuch as it is susceptible of various modifications without departing from the scope of the appended claims.

We claim:

1. A solid state hybrid switch for connecting an A.C. power supply source to a load (load turn-on) and disconnecting said source from said load (load turn-off) so as to limit electromagnetic interference (EMI) to a low value comprising:

a solid state circuit comprising solid state A.C. power switching means and a zero voltage crossing circuit for limiting operation of said solid state A.C. power switching means to portions of the voltage wave of said A.C. source having an amplitude below a given small value to limit said EMI:

bypass contacts for completing a connection from said source to said load independently of said solid state A.C. power switching means;

series contacts operable when closed for connecting said solid state A.C. power switching means in circuit with said source and load and operable when open for isolating said solid state A.C power switching means from said source;

control switching means effective when placed in "on" state for rendering said solid state A.C. power switching means operable under the control of said zero voltage crossing circuit and effective when restored to "off" state for rendering said solid state A.C. power switching means inoperative at or near zero current;

means responsive to closure of said series contacts for rendering said zero voltage crossing circuit operative to allow operation of said solid state A.C. power switching means when said source voltage goes below a given low value and said control switching means is in said "on" state and to prevent operation thereof whenever said source voltage is above said given value;

and contact control means operable on said load turn-on for closing said series contacts first, placing said control switching means in its "on" state next and closing said bypass contacts last and said contact control means being operable on said load turn-off for opening said bypass contacts first, restoring said control switching means to said "off" state next and opening said series contacts last;

said solid state A.C. power switching means being of a type that restores to stop conducting at the next zero current crossing of said A.C. source following said restoring of said control switching means to its "off" state.

2. The solid state hybrid switch claimed in claim 1, wherein:

said control means operable on load turn-on comprises sequence control means for closing said series contacts and placing said control switching means in its "on" state and closing said bypass contacts in a predetermined timed sequence.

3. The solid state hybrid switch claimed in claim 2, wherein:

said sequence control means comprises means for delaying the closure of said bypass contacts substantially the time of a half-cycle of said A.C. power supply source after said control switching means is in its "on" state to insure that said source voltage has gone below said given low value enabling operating of said solid state A.C. power switching means before said bypass contacts are closed.

4. The solid state hybrid switch claimed in claim 1, wherein:

said control means operable on load turn-off comprises said sequence control means for opening said bypass contacts and restoring said control switching means to said "off" state and opening said series contacts in a predetermined timed sequence.

5. The solid state hybrid switch claimed in claim 3, wherein:

said sequence control means comprises means for delaying the opening of said series contacts substantially the time of a half cycle of said A.C. power supply source after said control switching means is in its "off" state to insure that said source current has gone to zero value enabling restoration of said solid state A.C. power switching means to nonconducting state before said series contacts open.

6. The solid state hybrid switch claimed in claim 1, wherein:

said control switching means comprises control contacts that are closed in said "on" state and are open in said "off" state.

7. The solid state hybrid switch claimed in claim 6, wherein:

said control means comprises a manual switch having an actuator effective upon operation for closing said series contacts first, closing said control contacts next and closing said bypass contacts last and being effective upon restoration for opening said bypass contacts first, opening said control contacts next and opening said series contacts last.

8. The solid state hybrid switch claimed in claim 7, wherein:

said bypass contacts are connected across both said solid state circuit and said series contacts.

9. The solid state hybrid switch claimed in claim 8, wherein:

said manual switch comprises a housing with external terminals adapted to be connected to said source and said load;

said series contacts comprise a first common contact connected to one of said external terminals and a second contact connected to said solid state circuit and arranged to be engaged by said first common contact when said actuator is operated;

said control contacts comprise third and fourth contacts connected to said solid state A.C. power switching means and arranged to be closed following engagement of said series contacts when said actuator is operated further;

and said bypass contacts comprise a fifth contact connected to another of said external terminals and arranged to be engaged by said first, common contact when said actuator is operated further.

10. The solid state hybrid switch claimed in claim 9, wherein:

said actuator comprises a spring-biased pushbutton;

and said manual switch also comprises:

a push-push mechanism having a depressed load turn-on position and an undepressed or restored load turn-off position.

means responsive to depression of said pushbutton to its load turn-on position and release thereof for retaining said pushbutton in said load turn-on position;

and means responsive to subsequent depression of said pushbutton further and release thereof for restoring said pushbutton to its undepressed position under the force of its spring bias.

* * * * *